United States Patent
Kim

[11] Patent Number: 5,824,593
[45] Date of Patent: Oct. 20, 1998

[54] METHOD FOR MAKING A CAPACITOR ON A SEMICONDUCTOR DEVICE

[75] Inventor: Hong-Sun Kim, Dael-dong, Rep. of Korea

[73] Assignee: LG Semicon Co., Ltd., Chungcheongbuk-do, Rep. of Korea

[21] Appl. No.: 489,118

[22] Filed: Jun. 9, 1995

[30] Foreign Application Priority Data

Jun. 9, 1994 [KR] Rep. of Korea .................. 12995/1994

[51] Int. Cl.$^6$ .................................................. H01L 21/20
[52] U.S. Cl. .................. 438/397; 438/254; 148/DIG. 14
[58] Field of Search ................................. 437/47, 52, 60, 437/919, 229; 438/239, 253, 254, 396, 397; 148/DIG. 14

[56] References Cited

U.S. PATENT DOCUMENTS

| 5,071,781 | 12/1991 | Seo et al. | 437/60 |
|---|---|---|---|
| 5,268,322 | 12/1993 | Lee et al. | 437/60 |
| 5,416,037 | 5/1995 | Sato et al. | 437/60 |
| 5,449,635 | 9/1995 | Jun | 437/60 |
| 5,571,742 | 11/1996 | Jeong | 437/60 |

OTHER PUBLICATIONS

T. Ema et al "3–Dimensional Stacked Capacitor Cell for 16M and 64M DRAMs" 592–IEDM 88.

*Primary Examiner*—Tuan H. Nguyen

[57] ABSTRACT

Semiconductor memory device and method for fabricating the same for increasing the capacity of a capacitor by minimizing the capacitor area lost for a storage contact. The method includes steps of forming a transistor on a semiconductor substrate, forming a first insulation film over the entire surface of the substrate having the transistor formed thereon, forming a contact region exposing a designated part of the substrate by subjecting the first insulation film to a selective etching for forming a storage node contact, forming a first conductive layer, a second insulation film, and a second conductive layer successively over the entire surface of the substrate, forming a first mask pattern on the second conductive layer within the contact region spaces for a certain distance from the first insulation film pattern at least in one direction, subjecting the second conductive layer to an etching with the first mask pattern as a mask, forming a second mask pattern for forming a storage node contact on the second insulation film and the second conductive layer, subjecting the second insulation film with the second mask pattern as a mask, and forming a third conductive layer over the entire surface of the substrate so as to connect the first conductive layer and the second conductive layer.

12 Claims, 10 Drawing Sheets

FIG.3a
FIG.3b
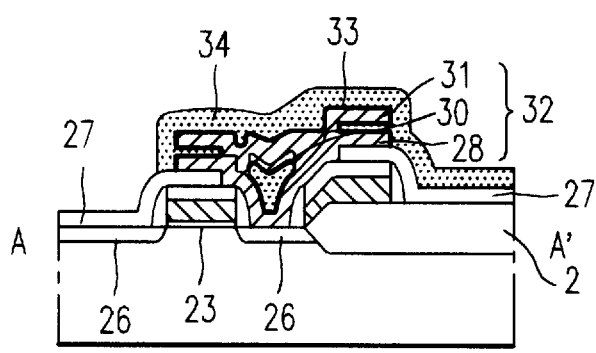
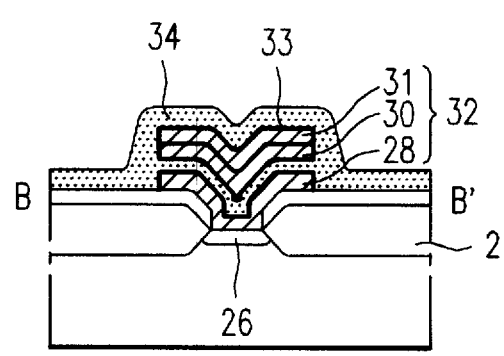

METHOD FOR MAKING A CAPACITOR ON A SEMICONDUCTOR DEVICE

FIELD OF THE INVENTION

This invention relates to a semiconductor memory device and method of making the same. More particularly it relates to a semiconductor memory device having, as an integral part thereof, large capacity capacitors and a method of making.

DESCRIPTION OF THE PRIOR ART

Advances in high integration of semiconductor memory devices have required capacitors of larger capacity. According to this, in a memory such as a DRAM, capacitors with various structures have been suggested to obtain a large capacity, of which a method for fabricating a finned structure capacitor capacity will be explained.

First, as shown in FIG. 1a, after forming a transistor having a gate insulation film 3, a gate electrode 4, and a source or drain (hereinafter S/D) on a semiconductor substrate 1 divided into an active region and an element separation region by a field oxide film 2, as shown in FIG. 1b, an SiN film 5 is deposited as an etch blocking layer over a substrate having a transistor formed thereon.

Then, as shown in FIG. 1c, after an oxide film is formed as a first insulation film 6 on the etch blocking layer 5, polysilicon is deposited thereon as a first conductive layer 7. An oxide film (being a second insulation film 8) is then formed on the first conductive layer 7, and a contact hole exposing the source and the drain S/D is formed by subjecting the second insulation film 8, the first conductive layer 7, the first insulation film 6, and the etch blocking layer 5 to an selective etching.

Next, as shown in FIG. 1d, after depositing a polysilicon layer as a second conductive layer 9 all over the substrate, as shown in FIG. 1e, the second conductive layer 9, the second insulation film 8, the first conductive layer 7, and the first insulation film 6 are subjected to a patterning having a capacitor storage node pattern.

Then, as shown in FIG. 1f, by removing the second insulation film and the first insulation film with a wet etching, a capacitor storage node 10 of a finned structure having the first conduction layer 7 and the second conductive layer 9 is formed.

Next, as shown in FIG. 1g, by forming a capacitor plate electrode 12 (through forming a dielectric film 11 all over the surfaces of the storage node 10, depositing a conduction material thereon, and subjecting them to a patterning), a capacitor is completed.

Although the foregoing finned structure capacitor can increase the capacity of the capacitor by increasing the capacitor area as a result of forming the capacitor in a multilayered structure, there is a limit on increasing a capacitor capacity since the storage node contact region cannot be utilized as a capacitor effective area, making the loss of area greater as the number of layers increase.

SUMMARY OF THE INVENTION

Objects of the present invention are to overcome the above limitation of the conventional art and provide a semiconductor memory device, and a method for fabricating the semiconductor memory device, which can increase a capacitor capacity by increasing a capacitor effective area by utilizing a storage node contact region.

These and other objects and features of this invention can be achieved by providing a capacitor of a semiconductor memory device including a semiconductor substrate having a contact region, a first conductive layer connected to the contact region, a second conductive layer having a plurality of pillars which are connected to the first conductive layer, a dielectric film on the first and second conductive layers and the plurality of pillars, and a third conductive layer on the dielectric film. There is further provided a method of making a capacitor of a semiconductor memory device including the steps of forming a first insulating layer having a contact hole on the substrate, forming a first conductive layer and a second insulating layer on the first insulating layer and in contact hole, removing the second insulating layer at the both sides of the contact hole to form via contact holes, forming a second conductive layer on the first conductive layer and the second insulating layer, removing the second insulating layer, forming a dielectric film on the first and second conductive layers, and forming a third conductive layer on the dielectric film.

BRIEF DESCRIPTION OF THE DRAWINGS

FIGS. 3a and 3b are sectional views taken along line A–A' and along line B–B', respectively, of FIG. 2.

DETAILED DESCRIPTION OF THE INVENTION

This invention is to be explained in detail hereinafter, referring to the attached drawings.

Figure 1A:
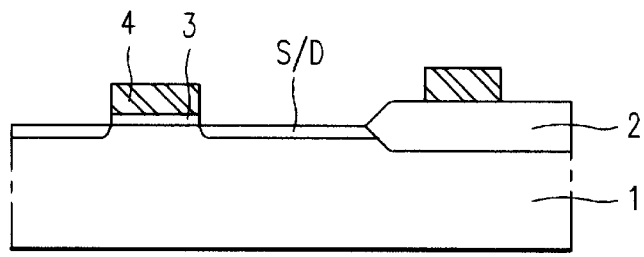
FIGS. 1a–1g are steps in a conventional method for fabricating a semiconductor memory device having a finned structure.
Figure 1B:
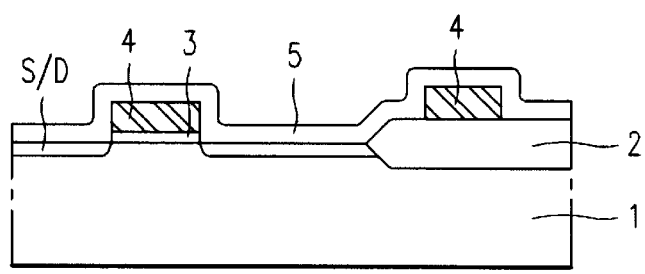
Figure 1C:
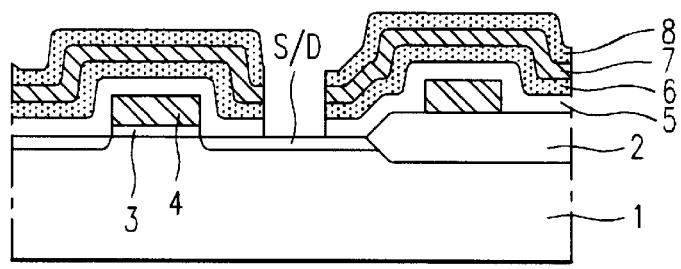
Figure 1D:
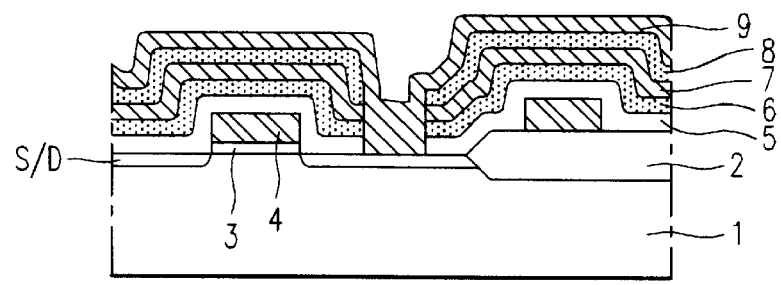
Figure 1E:
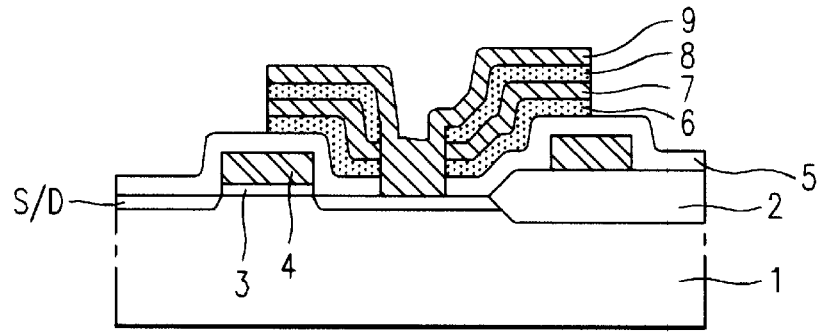
Figure 1F:
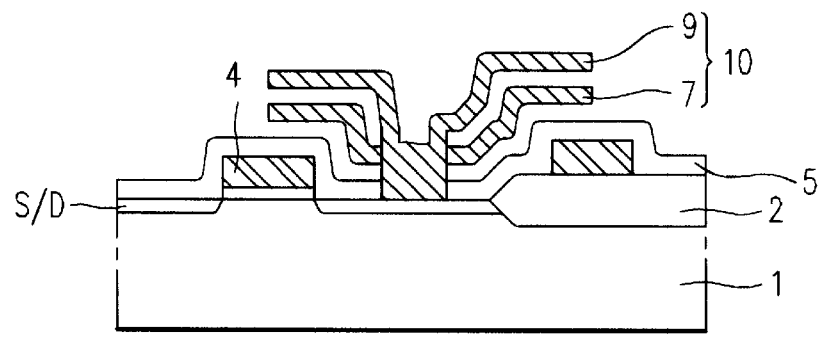
Figure 1G:
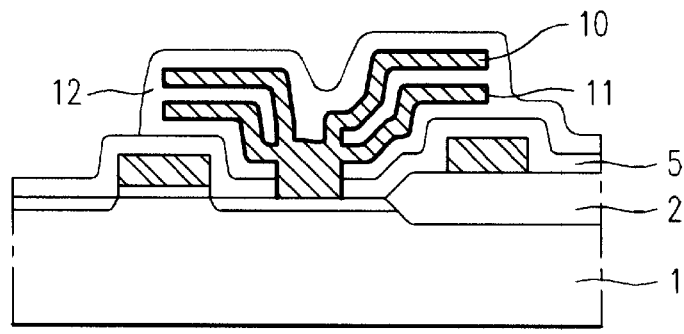
Figure 2:
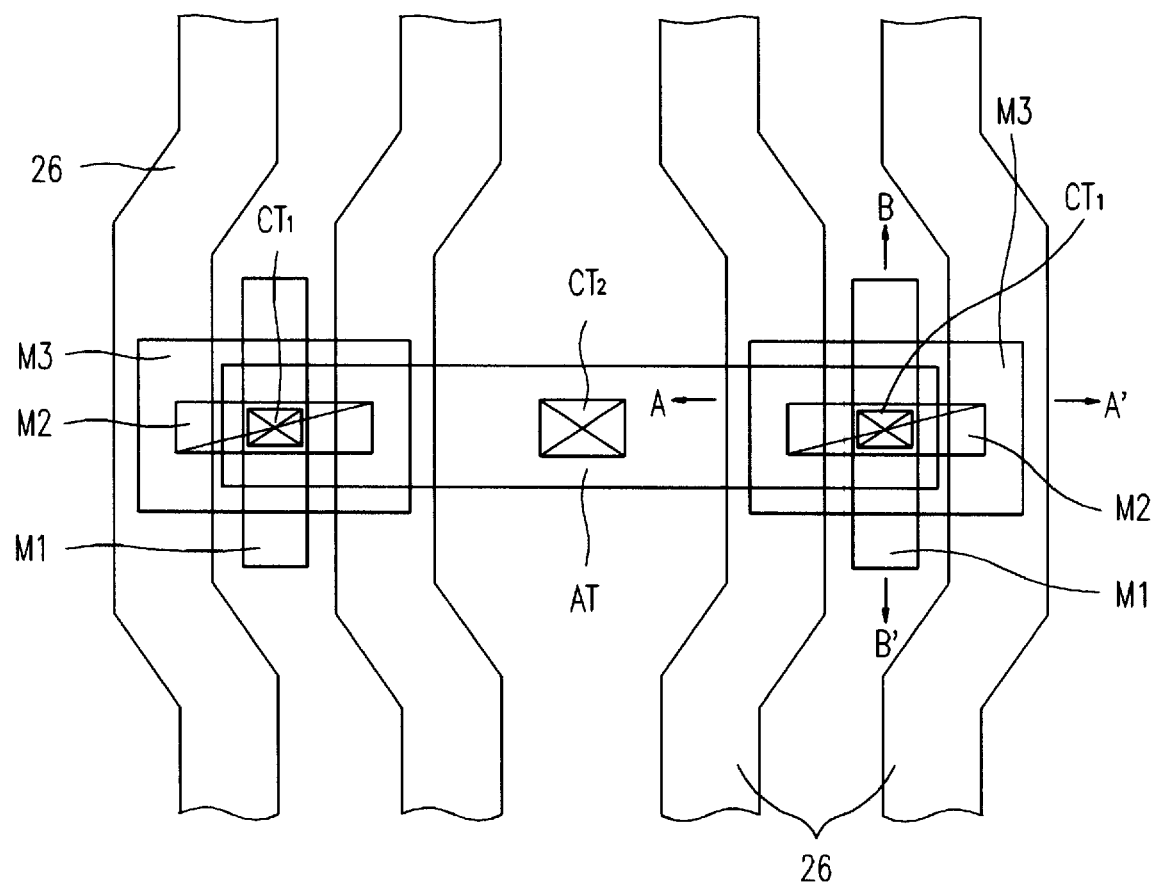
FIG. 2 is a layout of a semiconductor memory cell showing rectangular masking areas in accordance with a first embodiment of the invention.

FIG. 2 is a layout of a semiconductor memory cell in accordance with a first embodiment of this invention.

In FIG. 2, AT refers to an active region, $CT_1$ refers to a contact hole $CT_2$ refers to a bit line contact hole M1 indicates a mask pattern which is covered on the contact hole($CT_1$) and extended to the direction of the gate for forming an offset region, M2 indicates a mask pattern for forming a capacitor via contact hole and M3 indicates a mask pattern for forming a capacitor storage node.

As shown in FIGS. 3a and 3b, the semiconductor memory cell in accordance with one embodiment of this invention includes a first conductive layer 28 that is connected to a source/drain region 26 and formed on a semiconductor substrate 100. The memory cell has a transistor with a gate electrode 23 and a source/drain region 26. A second conductive layer 30 has a plurality of pillars ( only one is visible in the section of FIG. 3a) which are connected to the first conductive layer 28.

The first conductive layer 28 and second conductive layer 30, form a storage node 32. A capacitor dielectric film 33 is formed over the capacitor storage node 32, and a capacitor plate electrode 34 is formed over the capacitor dielectric film 33.

As can be seen, the semiconductor memory device of this invention allows an increase of capacitor capacity by utilizing the storage node contact part that has not been utilized as a capacitor region in the conventional finned structure capacitor.

Figure 4A:
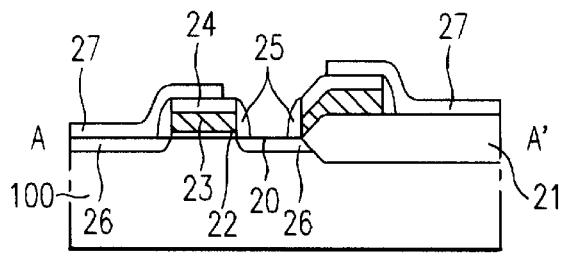
FIGS. 4a–4g illustrate intermediate steps in fabricating the semiconductor memory cell as viewed along line A–A' of FIG. 2.
Figure 5A:
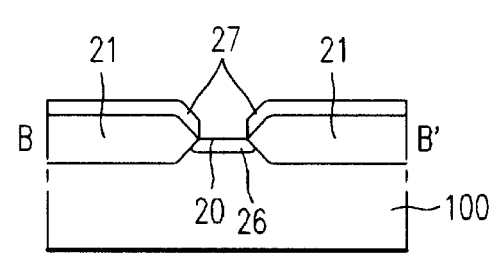
FIGS. 5a–5g illustrate intermediate steps in fabricating the semiconductor memory cell as viewed along line B–B' of FIG. 2.

A method of making a first embodiment of the invention will now be discussed. As shown in FIGS. 4a and 5a, after defining an active region for forming an element therein and an element separation region for separating elements by forming a field oxide film 21 at a designated part of a p type substrate 100, a gate insulation film 22, a conductive layer 23 for forming a gate electrode, and a gate cap oxide film 24 are formed on the substrate including the active region successively, which are subjected to a patterning with a designated gate pattern using a photo etching process.

Then, after injecting n type impurity ions of low concentration in the substrate at both sides of the gate electrode (for forming gate sidewall spacers 25 on the sidewalls of the gate electrode), an oxide film is deposited on the substrate and the gate electrode and is subjected to etching back. By injecting n type impurity ions of high concentration in the substrate, a source and drain (S/D) are formed in regions 26, resulting in a completed transistor.

By forming, for example, an oxide film as a first insulating film 27 over the substrate having the transistor and subjecting the first insulating film 27 to a selective etching, a contact hole is formed exposing either the source or the drain in region 26 of the transistor for forming a storage node contact hole.

Figure 4B:
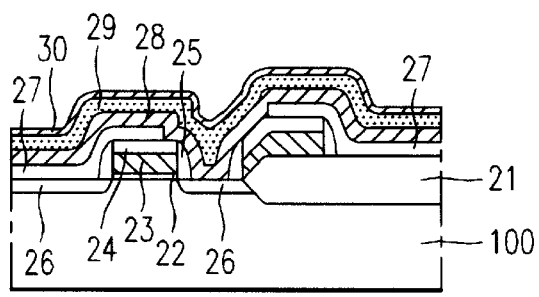
Figure 5B:
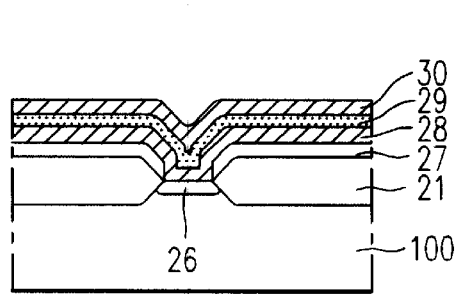

Next, as shown in FIGS. 4b and 5b, a first conductive layer 28, a second insulating film 29, and a masking layer 30 are formed successively over the substrate having the transistor.

It is desirable to have the first conductive layer and the masking layer formed from polysilicon.

Figure 4C:
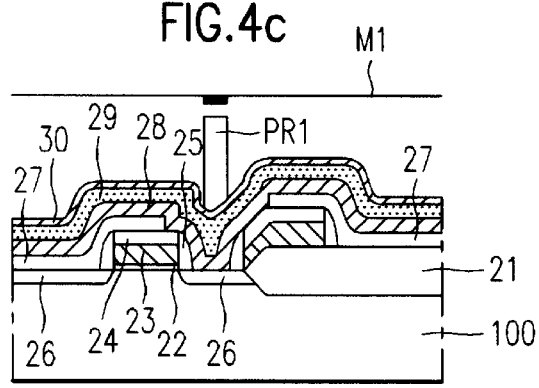
Figure 5C:
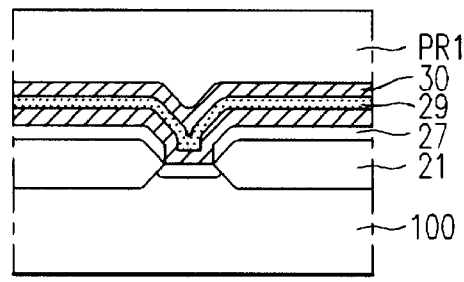

Then, as shown in FIGS. 4c and 5c, by coating photoresist film (PR1) on the masking layer 30 and patterning the photoresist film to form a mask pattern on a contact region which corresponds to the source and drain region 26, a first photoresit pattern M1 is formed.

Figure 4D:
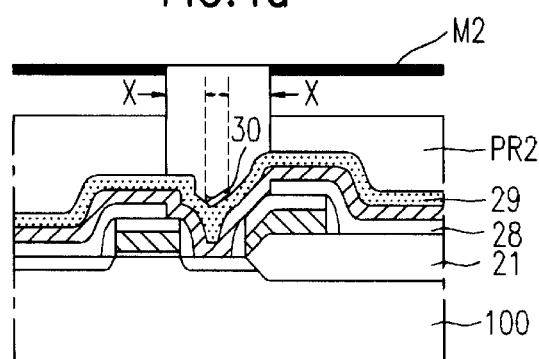
Figure 5D:
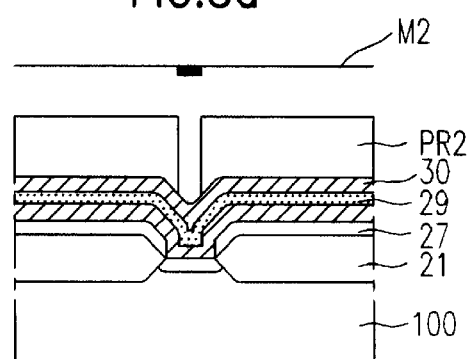

As shown in FIGS. 4d and 5d, after etching the masking layer 30 with the first photoresist pattern M1 as a mask, the first photoresist pattern is removed. After coating photoresist film (PR2) over the second insulating film 29 and the masking layer 30 and patterning the second photoresist film, a second photoresist pattern (M2) is formed on the second insulating layer so as to be spaced from both sides of the contact region and, spaced a certain distance x (illustrated in FIG. 4d) photoresist pattern M1.

Figure 4E:
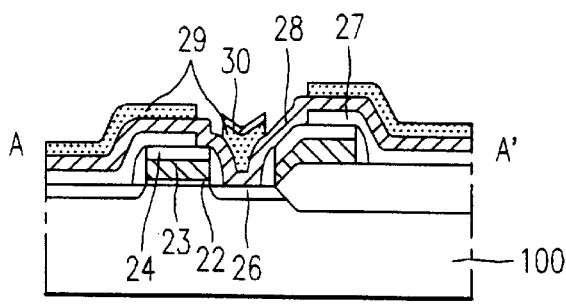
Figure 5E:
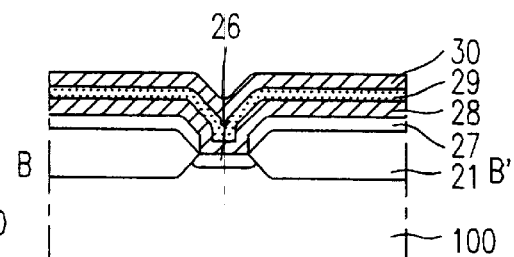

Next, as shown in FIGS. 4e and 5e, after etching the second insulation film 29 with the second photoresist pattern M2 as a mask to form via contact holes, the second photoresist pattern (M2) is removed.

Figure 4F:
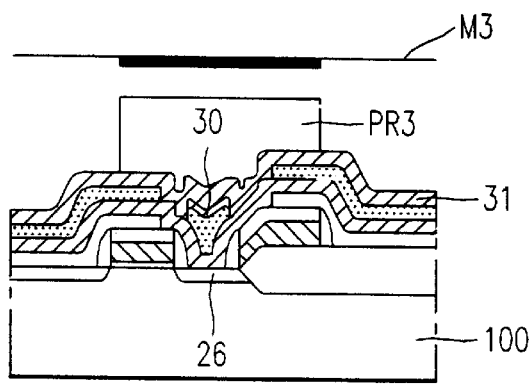
Figure 5F:
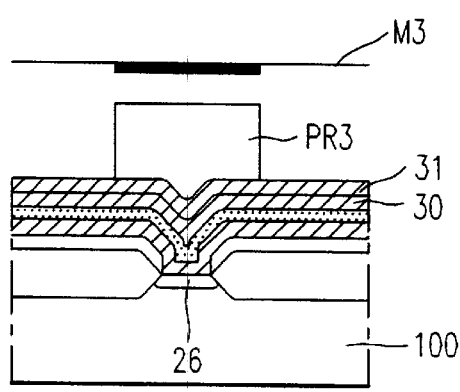

As shown in FIGS. 4f and 5f, after forming a second conductive layer 31 on the masking layer 30, on the second insulating layer 29 and on the first conductive layer 28 a third photoresist film(PR3) is coated thereon. Then, by patterning the third photoresist film (PR3) for forming a storage node pattern on the second conductive layer 31 with a photo process using the mask M3 shown in FIG. 2, a third photoresist pattern M3 is formed.

Figure 4G:
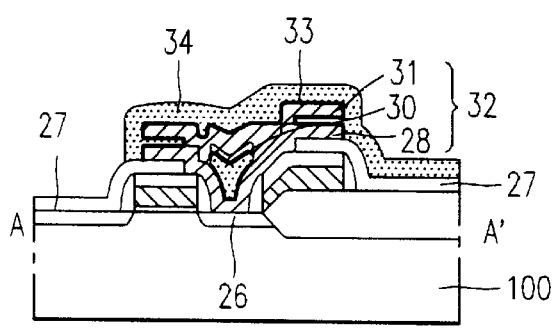
Figure 5G:
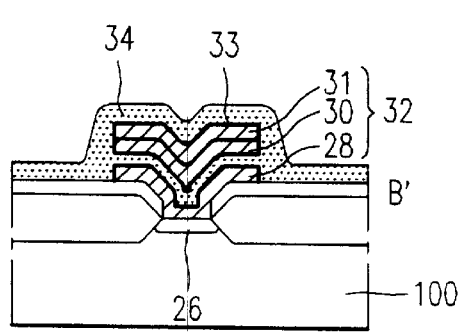
Figure 6A:
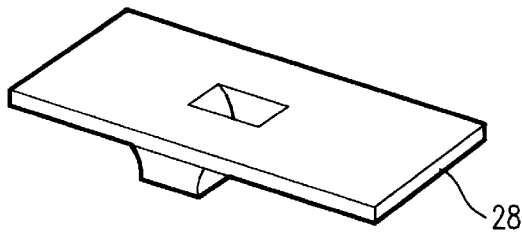
FIGS. 6a–6h illustrate intermediate steps in fabricating the semiconductor memory cell of FIG. 2 as shown in perspective.
Figure 6E:
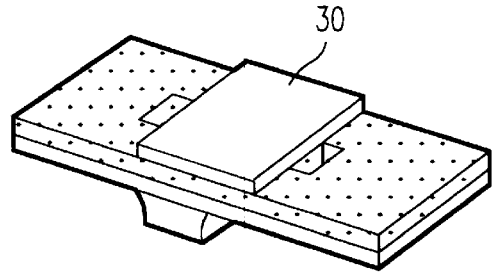
Figure 6B:
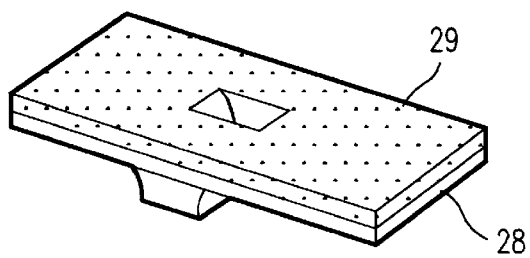
Figure 6F:
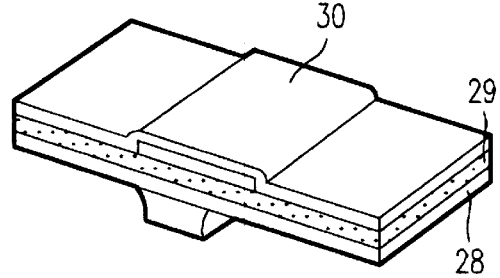
Figure 6C:
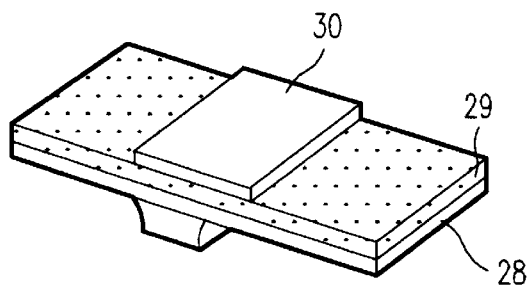
Figure 6G:
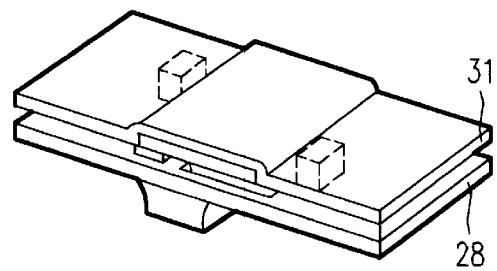
Figure 6D:
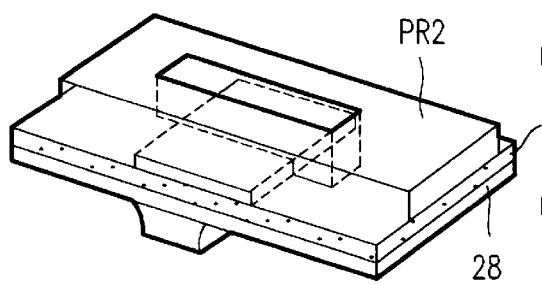
Figure 6H:
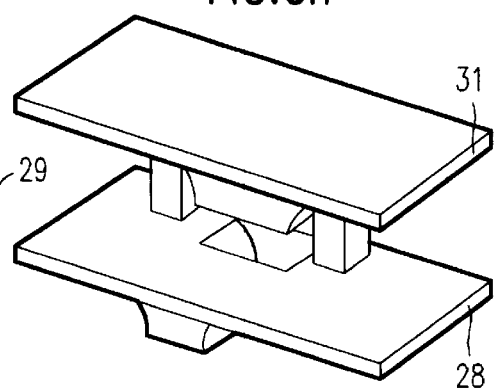

As shown in FIGS. 4g and 5g, after subjecting the second conductive layer 31 and the masking layer 30 to etching with the third photoresist pattern M3 as a mask and removing the second insulating film 29 by using a wet etching, followed by a subsequent etching of the first conductive layer 28 using the third photoresist pattern M3 as a mask, a capacitor storage node 32 having the first conductive layer 28, the masking layer 30, and the second conductive layer 31 are formed.

After the formation of the capacitor storage node 32, a dielectric film 33 is deposited on the storage node 32, and a capacitor plate electrode is formed on the dielectric film 33, The dielectric film 33 is formed from an oxide-nitride film, and the capacitor plate electrode 34 is formed from a polysilicon layer. The capacitor plate electrode 34 is subjected to a patterning with a designated pattern through a photo etching process so as to form a capacitor.

FIGS. 6a–6hillustrate, in perspective view, intermediate stages in the formation of the device of the first embodiment wherein the labelling corresponds to that previously indicated.

A second embodiment of the invention will now be described.

Figure 7:
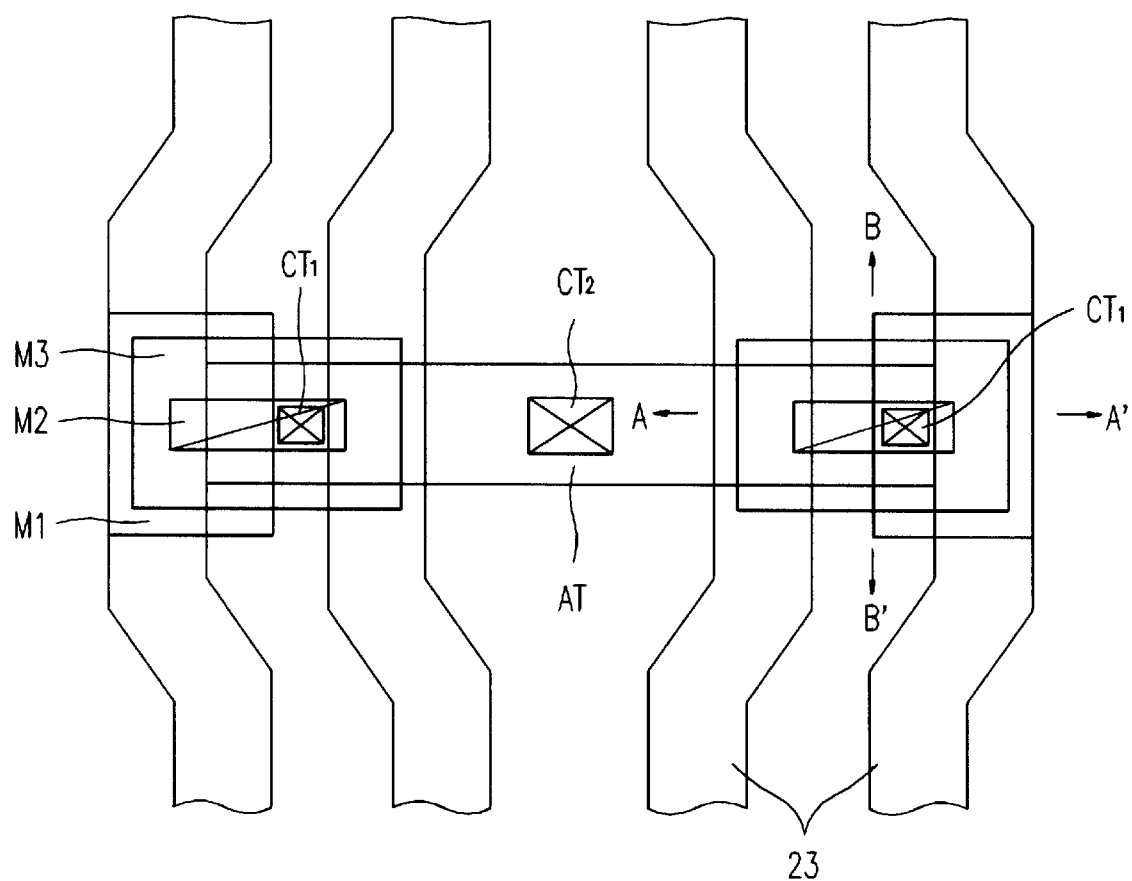
FIG. 7 is a layout of a semiconductor memory cell showing rectangular masking areas in accordance with a second embodiment of the invention.

In FIG. 7, "AT" refers to an active region, "$CT_1$" refers to a contact hole, CT2 refers to a bitline contact hole, 23 refers to a gate, "M1" indicates a mask pattern which is covered on one side portion of the contact hole and extended in the direction of the gate, "M2" indicates a mask pattern for forming via contact holes, and "M3" indicates a mask pattern for forming a capacitor storage node.

Figure 8A:
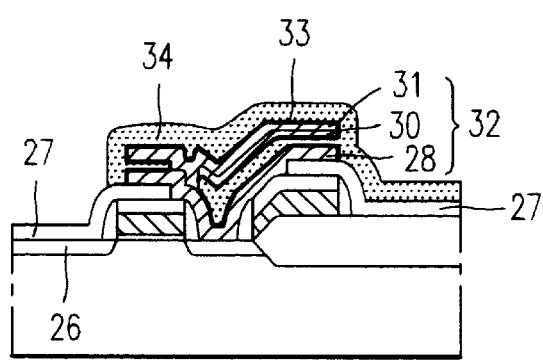
FIGS. 8a and 8b show sections of a semiconductor memory device structure in accordance with a second embodiment of the invention, taken along lines A–A' and B–B' of FIG. 6, respectively.
Figure 8B:
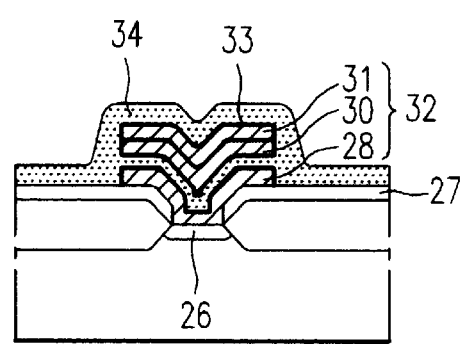

As shown in FIGS. 8aand 8b, the semiconductor memory cell in accordance with the second embodiment of this invention includes a first conductive layer 28 connected to a contact region 26 formed on a semiconductor substrate 100.

The semiconductor substrate 100 has a transistor with a gate electrode 23 and source as well as drain regions 26, and a masking layer 30 and second conductive layer 31 formed thereon. The second conductive layer 31 is formed connected with the first conductive layer 28 at one side portion of the contact region, and the masking layer 30 is formed connected to the other side portion of the first conductive layer 28 and on the underside of the second conductive layer 31 over the center part of the first conductive layer 28.

The first conductive layer 28, masking layer 30 and second conductive layer 31 form a storage node 32. A capacitor dielectric film 33 and a capacitor plate electrode 34 are formed successively over the storage node 32.

As can be seen, the semiconductor memory cell of this invention allows an increase of capacitor plate area by utilizing a portion of the contact node in making the capacitor. This is accomplished by forming the capacitor storage area even over surface areas that have not been utilized previously for this purpose.

Figure 9A:
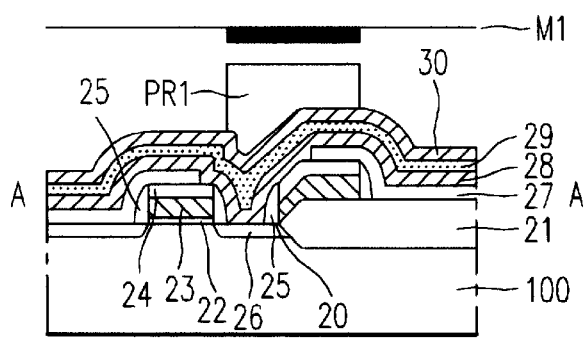
FIGS. 9a–9d illustrate a method for fabricating a semiconductor memory device in accordance with a second embodiment of the invention, as viewed along line A–A' of FIG. 6.
Figure 10A:
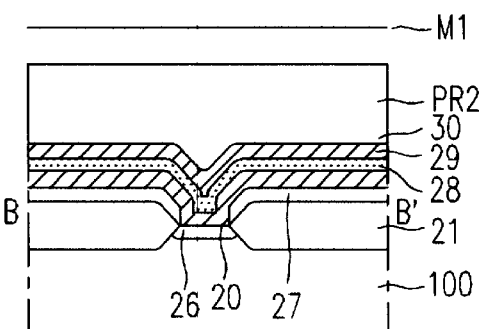
FIGS. 10a–10d illustrate a method for fabricating a semiconductor memory device in accordance with the second is embodiment of the invention, as viewed along line B–B' of FIG. 6.

First, as shown in FIGS. 9a and 10a, after defining an active region and an element separation region by forming a field oxide film 21 at a designated part of a p type substrate 100, a gate insulation film 22, a conductive layer 23 (for forming a gate electrode), and a gate cap oxide film 24 are formed successively, and are subjected to a patterning with a designated gate pattern using a photo etching process.

Then, after injecting n type impurity ions of low concentration therein and by depositing an oxide film over the substrate and subjecting it to an etch back, side wall spacers 25 are formed at the sidewalls of the gate, and by injecting n-type impurity ions therein in high concentration, source/drain regions 26 are formed, thereby forming a completed transistor.

Then by forming, for example, an oxide film over the substrate having the transistor formed therein as a first insulation film 27 and subjecting it to a selective etching, a contact hole is formed. Thus the source/drain 26 region of the transistor is exposed for forming a storage node contact hole.

Then, a first conductive layer 28, a second insulation film 29, and a masking layer 30 are formed successively over the substrate.

It is desirable to have the first conductive layer and the masking layer formed from polysilicon.

Then, by coating a first photoresist film PR1 on the second conductive layer 30 and using a photo process with a mask pattern M1 (i.e., in the same manner as previously described for FIG. 4) a first photoresist pattern M1 is formed as shown in FIGS. 4c and 5c.

Figure 9B:
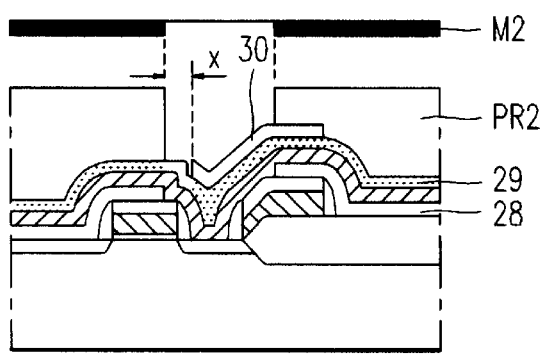
Figure 10B:
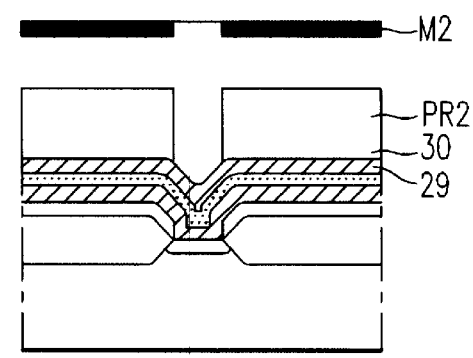

Then, as shown in FIGS. 9b and 10b, after etching the masking layer 30 with the first photoresist pattern M1 as a mask, the first photoresist pattern is removed. Then, after coating a second photoresist film PR2 over the surface thereon again, by patterning the second photoresist film PR2 for forming the mask pattern M2, the second photoresist patterns M2 are formed spaced a distance x from each side of the first photoresist pattern M1.

Figure 9C:
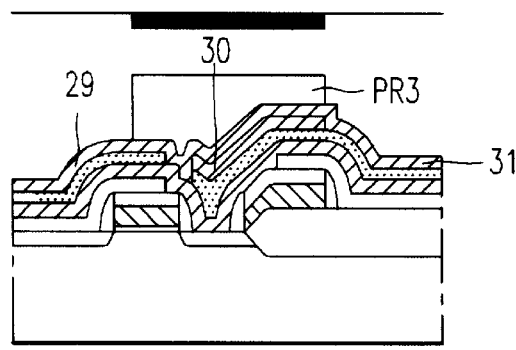
Figure 10C:
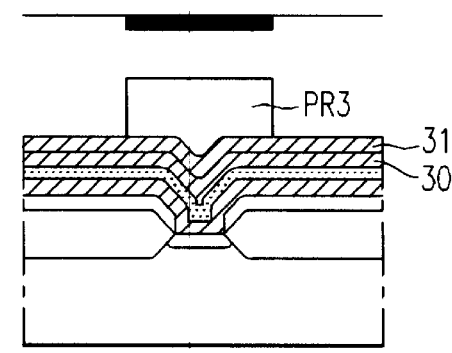
Figure 9D:
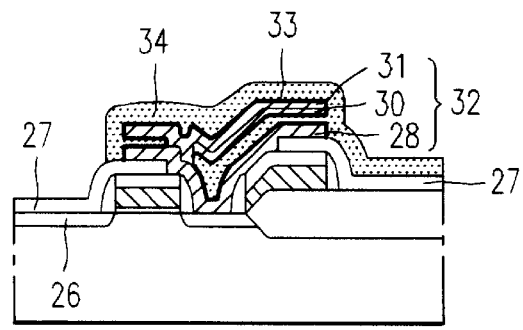
Figure 10D:
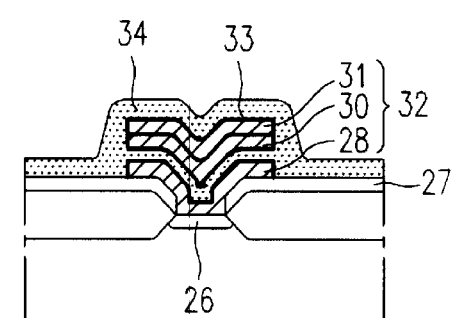

Next, as shown in FIGS. 9c and 10c, after etching the second insulation film 29 with the second photoresist pattern M2(FIG. 7) as a mask, the second photoresist pattern is removed.

After forming a second conductive layer 31 over the substrate for connecting the first conduction layer 28 to the masking layer 30, a third photoresist film PR3 is coated thereon. Then, by patterning the third photoresist film PR3 with a photo process using the mask in FIG. 7, a third photoresist pattern M3 is formed.

Then, as shown in FIGs, 9d and 10d, after subjecting the second conductive layer 31 and the masking layer 30 to an etching with the third photoresist pattern M3 as a mask and removing the second insulation film 29 (which has been exposed due to the above etching) with a wet etching, with an etching of the first conductive layer 28 using the third photoresist pattern M3 as a mask, separation between cells as well as formation of a capacitor storage node 32 having the first conductive layer 28, the masking layer 30, and the third conductive layer 31 are completed, and by forming a capacitor plate electrode 34 through forming a dielectric film 33 over the entire surface of the capacitor storage node 32, and depositing a conductive material over the dielectric material 33, a capacitor can be completed.

Although the conventional finned structure capacitor, having a finned structure storage node formed only on both sides of the storage node contact region, could not have utilized the storage node contact part for increasing the capacitor capacity, this invention allows one to utilize even the storage contact region so as to increase the capacitor capacity.

Further, since a capacitor is formed by forming the storage node contact in advance (i.e., forming the first conductive layer after forming the cell transistor and then forming the capacitor by depositing a stack of insulation films and conduction layers and subjecting them to etchings), a reduction in over etch is achieved as compared to the case where a contact hole for a storage node contact is formed by stacking multi-layers of insulation layers and conductive layers and subjecting them to etchings. Thus, a simple process for forming the storage node is achieved.

It is evident that the offset region of a semiconductor memory cell in accordance with this invention can be formed in any form in the storage node region.

Although the invention has been described in conjunction with specification embodiments, it is evident that many alternatives and variations that fall within the spirit and scope of the appended claims.

What is claimed is:

1. A method for making a capacitor on a semiconductor device comprising the steps of:
   providing a semiconductor device;
   forming a first insulating layer, having a first contact hole on said semiconductor device;
   forming a first conductive layer on the first insulating layer and in the first contact hole;
   forming a second insulating layer on the first conductive layer such that said second insulating layer at least partially fills said first contact hole;
   selectively removing a portion of the second insulating layer at both sides of the first contact hole to form second and third contact holes in the second insulating layer;
   forming a second conductive layer on the second insulating layer and in the second and third contact holes;
   removing the second insulating layer remaining under the second conductive layer;
   forming a dielectric film on the first and second conductive layers; and
   forming a third conductive layer on the dielectric film such that said third conductive layer at least partially fills said first contact hole.

2. The method as claimed in claim 1, wherein the first, second and third conductive layers are polysilicon layers.

3. The method as claimed in claim 1,
   wherein the first and second insulating layers are oxide layers.

4. The method as claimed in claim 1,
   wherein the dielectric film is made of an oxide-nitride.

5. The method as claimed in claim 1, wherein the step of providing includes providing a transistor as the semiconductor device.

6. A method for making a capacitor on a semiconductor device comprising the steps of:
   providing a semiconductor device;
   forming a first insulating layer, having a first contact hole on said semiconductor device;
   forming a first conductive layer on the first insulating layer and in the first contact hole;
   forming a second insulating layer on the first conductive layer;

selectively removing a portion of the second insulating layer at both sides of the first contact hole to form second and third contact holes in the second insulating layer;

forming a second conductive layer on the second insulating layer and in the second and third contact holes;

removing the second insulating layer remaining under the second conductive layer;

forming a dielectric film on the first and second conductive layers;

forming a third conductive layer on the dielectric film;

forming a first masking layer on a portion of the second insulating layer which corresponds to the first contact hole;

forming a second masking layer on the second insulating layer spaced from both sides of the first contact hole; and removing the second insulating layer to form the second and third contact holes by using the first and second masking layers as a mask.

7. The method as claimed in claim 6, wherein the first masking layer is made of polysilicon.

8. The method as claimed in claim 6, wherein the second masking layer is made of a photoresist.

9. A method for making a capacitor on a semiconductor device comprising the steps of:

providing a semiconductor device;

forming a first insulating layer, having a first contact hole on said semiconductor device;

forming a first conductive layer on the first insulating layer and in the first contact hole;

forming a second insulating layer on the first conductive layer such that said second insulating layer at least partially fills said first contact hole;

selectively removing a portion of the second insulating layer at one side of the first contact hole to form a second contact hole in the second insulating layer;

forming a second conductive layer on the second insulating layer and in the second contact hole;

removing the second insulating layer remaining under the second conductive layer;

forming a dielectric film on the first and second conductive layers; and forming a third conductive layer on the dielectric film such that said third conductive layer at least partially fills said first contact hole.

10. The method as claimed in claim 9, wherein the step of providing includes providing a transistor as the semiconductor device.

11. A method for making a capacitor on a semiconductor device comprising the steps of:

providing a semiconductor device;

forming a first insulating layer, having a first contact hole on said semiconductor device;

forming a first conductive layer on the first insulating layer and in the first contact hole;

forming a second insulating layer on the first conductive layer;

selectively removing a portion of the second insulating layer at one side of the first contact hole to form a second contact hole in the second insulating layer;

forming a second conductive layer on the second insulating layer and in the second contact hole;

removing the second insulating layer remaining under the second conductive layer;

forming a dielectric film on the first and second conductive layers;

forming a third conductive layer on the dielectric film;

forming a first masking layer on the second insulating layer corresponding to the first contact hole;

forming a second masking layer on the second insulating layer spaced from one side of the first contact hole; and removing the second insulating layer to form the second contact hole by using the first and second masking layers as masks.

12. A method for making a capacitor on a semiconductor device comprising the steps of:

forming a first insulating layer having a contact region on the semiconductor device;

forming a first conductive layer on the first insulating layer in the contact region;

forming a second insulating layer on the first conductive layer such that said second insulating layer at least partially fills said contact region;

selectively removing a portion of the second insulating layer in the contact region to form first and second contact holes in the second insulating layer;

forming a second conductive layer on the second insulating layer and in the first and second contact holes;

removing the second insulating layer;

forming a dielectric film on the first and second conductive layers; and forming a third conductive layer on the dielectric film such that said third conductive layer at least partially fills said first contact hole.

* * * * *